United States Patent [19]
Tanaka

[11] Patent Number: 5,177,753
[45] Date of Patent: Jan. 5, 1993

[54] SEMI-CONDUCTOR LASER UNIT
[75] Inventor: Haruo Tanaka, Kyoto, Japan
[73] Assignee: Rohm Co., Ltd., Kyoto, Japan
[21] Appl. No.: 715,362
[22] Filed: Jun. 14, 1991
[30] Foreign Application Priority Data
  Jun. 14, 1990 [JP] Japan .................. 2-156206
[51] Int. Cl.⁵ ................................. H01S 3/04
[52] U.S. Cl. ........................ 372/36; 372/34; 372/50; 437/2; 437/214
[58] Field of Search ............ 372/43, 34, 44, 36, 372/50; 357/72, 73, 74, 75, 19
[56] References Cited
  U.S. PATENT DOCUMENTS
  4,745,294  5/1988  Kohashi et al. ............ 357/19
  4,768,081  8/1988  Moeller ..................... 357/72
  5,052,005  9/1991  Tanaka et al. .............. 357/72

FOREIGN PATENT DOCUMENTS
  0260385 11/1987 Japan .................. 372/43
  0125688  5/1990 Japan .................. 372/43

Primary Examiner—Georgia Y. Epps

[57] ABSTRACT

A semi-conductor laser unit is provided which includes a substrate, and a laser chip bonded on the substrate through a submount so as to project laser beam towards the outside from a front cleavage face of the laser chip. The front cleavage face of the laser chip is covered by a transparent resin material, with a front face of the transparent resin material being formed into a smooth face. As a result, the beam characteristics and resistance against the environment for the semi-conductor laser are improved.

14 Claims, 3 Drawing Sheets

SEMI-CONDUCTOR LASER UNIT

BACKGROUND OF THE INVENTION

The present invention generally relates to a diode unit, and more particularly, to a semi-conductor laser unit such as an injection type semi-conductor laser unit (of a laser diode) and the like.

Recently, in the field of semi-conductor laser units, there has been a tendency that an injection type semi-conductor laser unit or a so-called laser diode is mainly employed, which is so arranged that a laser chip subjected to the PN junction, or single hetero-junction or a double hetero-junction is bonded on a substrate through a sub-mount, so that a laser may be emitted towards the outside from a front cleavage face of said laser chip.

Such semi-conductor laser units may be broadly divided into a so-called can seal type in which a window of a light-transmitting material capable of emitting outside the laser beam from the front cleavage face of a laser chip is provided on a can package for covering the unit, while the laser beam from a rear cleavage face of the laser chip is arranged to be received by a light receiving element of a photo-diode, and into an open unit type in which the laser chip subjected to the PN junction, or single hetero-junction or double hetero-junction is bonded on a substrate through a sub-mount. A while a light receiving element of a photo-diode is formed at a portion of the substrate for monitoring the laser beam from the rear cleavage face of the laser chip by the light receiving element.

In the semi-conductor laser unit of the open type referred to above, because the junction between the laser chip and the sub-mount, etc., is exposed to atmosphere, water component tends to enter the junction due to dew formation by the moisture to give rise to deterioration in the characteristics of the semi-conductor chip, thus resulting in inferior resistance against environmental conditions.

SUMMARY OF THE INVENTION

Accordingly, an essential object of the present invention is to provide a semi-conductor laser unit which is superior in the beam characteristics and resistance against environment and substantially eliminates the disadvantages inherent in the conventional semi-conductor laser units of this kind.

Another object of the present invention is to provide a semi-conductor laser unit of the above described type which is simple in construction and stable in functioning a high reliability, and can be readily manufactured on a large scale at low cost.

In accomplishing these and other objects, according to one preferred embodiment of the present invention, there is provided a semi-conductor laser unit which includes a substrate, and a laser chip bonded on said substrate through a sub-mount so as to project a laser beam towards the outside from a front cleavage face of said laser chip. The front cleavage face of the laser chip is covered by a transparent resin member, with a front face of the transparent resin member being formed into a smooth face.

By the arrangement according to the present invention as referred to above, an improved semi-conductor laser unit has been advantageously provided through simple construction.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE PREFERRED EMBODIMENTS OF THE PRESENT INVENTION

Figure 1:
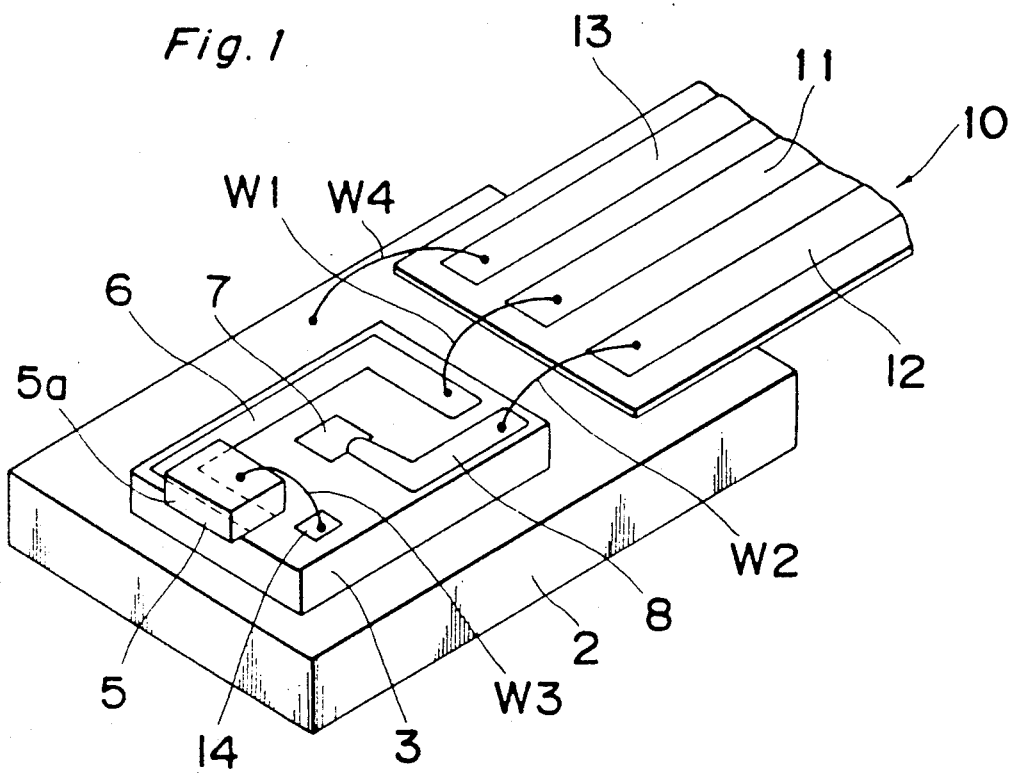
FIG. 1 is a perspective view showing the general construction of a unit type semi-conductor laser unit according to an embodiment of the present invention, with a solid state waveguide member and a transparent resin member to be described later being omitted for clarity of construction.

Before the description for the embodiments of the present invention proceeds, it is to be noted that like parts are designated by like reference numerals throughout the accompanying drawings.

Referring now to the drawings, there is shown in FIG. 1, the general construction of a semi-conductor laser unit of a unit type according to an embodiment of the present invention.

In FIG..2, a laser unit L1 of the so-called unit type for a first embodiment according to the present invention generally includes a substrate or base 2, a laser chip 5 bonded on the substrate 2 through a sub-mount 3, and a monitor element 7 formed on the sub-mount 3.

The substrate 2 is prepared by applying nickel plating and gold plating over the surface of an aluminum plate. At a portion slightly behind a forward edge of the substrate 2, the sub-mount 3 is fixedly mounted or bonded on the upper surface of the substrate 2, by a connecting material such as indium or the like.

The sub-mount 3 fundamentally includes a rectangular plate material of silicon on formed its surface, with an aluminum wiring 6 for supplying power to the laser chip 5 and another aluminum wiring 8 (FIG. 1) for deriving electric current produced on the sub-mount 3 by the action of the monitor element 7 to be described more in detail later, through a silicon dioxide film (not shown) provided over the surface of the sub-mount 3. Towards a forward end side of the aluminum wiring 6 on the upper surface of the sub-mount 3, the laser chip 5 is connected or bonded by an electrically conductive brazing material 9. In the above case, the laser chip 5 is in the state of PN junction, a single hetero-junction, or a double hetero-junction, and the front cleavage face 5a of the laser chip 5 is in a state where it slightly protrudes forward from the front face edge of the sub-mount 3, while the rear cleavage face 5b is directed to the rear on the submount 3.

At an approximately central portion on the surface of the sub-mount 3, in a region adjacent to the rear cleavage face 5b on the laser chip 5, the light receiving element 7 of a photo-diode formed by the PN junction, or a pin photo-diode through diffusion of a P type impurity from the surface of the sub-mount 3. etc. is provided. and the aluminum wiring 8 is connected to the light receiving element 7.

The aluminum wirings 6 and 8 are respectively connected to the corresponding leads 11 and 12 (FIG. 1) on a flexible circuit 10 connected at a rear portion of the substrate 2 by wire bonding through wires W1 and W2 (FIG. 1), while a negative electrode of the laser chip 5 is bonded by a wire W3 to a pad 14 (FIG. 1) conducted inside by partly cutting open the silicon dioxide film on the submount for electrical connection to the substrate 2. which is further bonded by a wire W4 to the predetermined lead 13 (FIG. 1 on the flexible circuit 10.

A transparent resin material 15 is formed to cover the front cleavage face 5a of the laser chip 5. and the front face of the transparent resin material 15 is formed into a smooth face 15a.

For the above purpose, the transparent resin material 15 is formed, for example, by a thermo-setting resin by a two-liquid mixture such as the epoxy resin, etc., or by a silicon resin which may be hardened by heat drying or natural drying.

Figure 2:
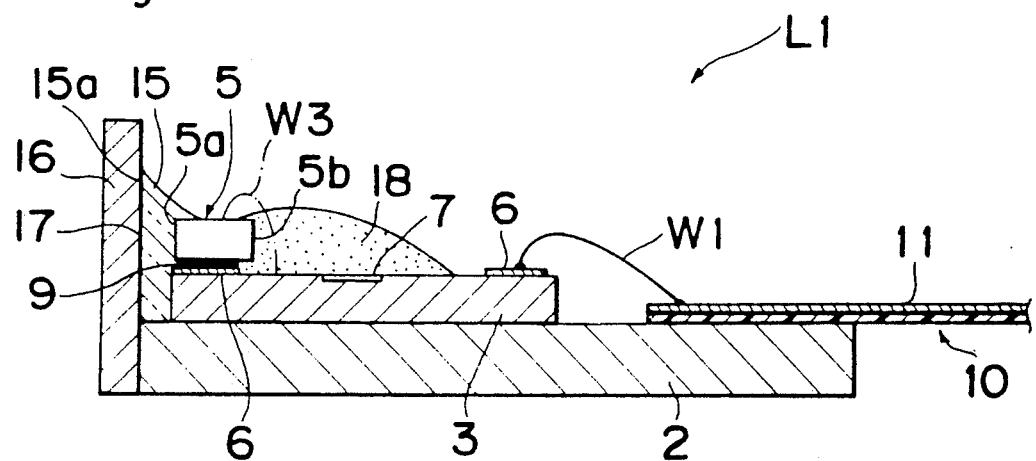
FIG. 2 is a side sectional view of a unit type semi-conductor laser unit according to a first embodiment of the present invention.

As shown in FIG. 2, with a flat plate 16 of a glass or the like erected at the front face side of the substrate 2. and a parting agent 17 applied over one face (i.e. the side confronting the front cleavage face 5a) of the flat plate 16. when the transparent resin material 15 in a viscous liquid state is filled between the flat plate 16 and the front cleavage face of the laser chip 5, the resin material 15 is perfectly filled by a capillary action thereof, whereby the flat plane 16 is fixed to the submount 3 and the laser unit for the first embodiment is completed.

Figure 3:
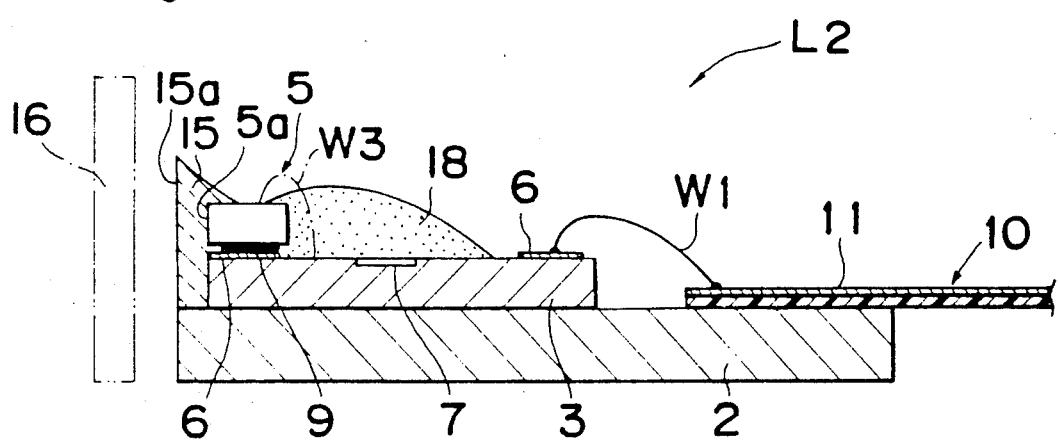
FIG. 3 is a view similar to FIG. 2, which particularly shows a second embodiment of the present invention.

In the above state, after hardening the transparent resin material 15, when the flat plate 16 is removed as shown in a two-dotted line in FIG. 3, a flat smooth face 15a is formed at the front face of the transparent resin material 15 as in FIG. 3 showing a laser unit L2 for the second embodiment of the present invention.

In order to improve the flatness and surface roughness on the smooth face 15a at the front face of the transparent resin material 15, it may be so arranged to effect polishing after molding.

Furthermore, a solid state waveguide member 18 is provided for connecting the rear cleavage face 5b of the laser chip 5 and the upper face of the light receiving element 7, and the waveguide member 18 is formed by dropping a thermo-setting resin in a liquid state such as an epoxy resin, a silicon resin, etc., over the surfaces of the rear cleavage face 5b and the light receiving element 7 for subsequent hardening. By the above practice, due to difference in the refractive indices between the solid state waveguide 18 and air, the laser beam emitted to the rear from the rear cleavage face 5b passes through the solid state waveguide member 18, and most of the laser beam is generally subjected to total reflection at the outer peripheral face of the solid state waveguide member 18 so as to reach the light receiving element 7.

Accordingly, upon impression of a predetermined voltage to the leads 11 and 12, the laser beam is emitted from the front and rear cleavage faces 5a and 5b, and the laser beam from the front cleavage face 5a is directed in the direction of a normal line of the smooth face 15a through the transparent resin material 15.

It is to be noted here that a still better result may be obtained if an AR (anti-refractive) coating for prevention of reflection is applied over the smooth face 15a of the transparent resin material 15 in the case of the second embodiment (FIG. 3) For the first embodiment (FIG. 2), the AR coating may be applied over the outer side of the flat plane 16.

On the other hand, the laser beam from the rear cleavage face 5b propagates through the solid state waveguide member 18, and reaches the light receiving element 7, thereby to produce electric current corresponding to the intensity of the laser beam. Therefore, this current is monitored to transmit the data to a control circuit (not shown) for feed-back control so as to actuate a laser drive circuit (not shown) in order to emit the laser beam of a predetermined intensity.

Figure 4:
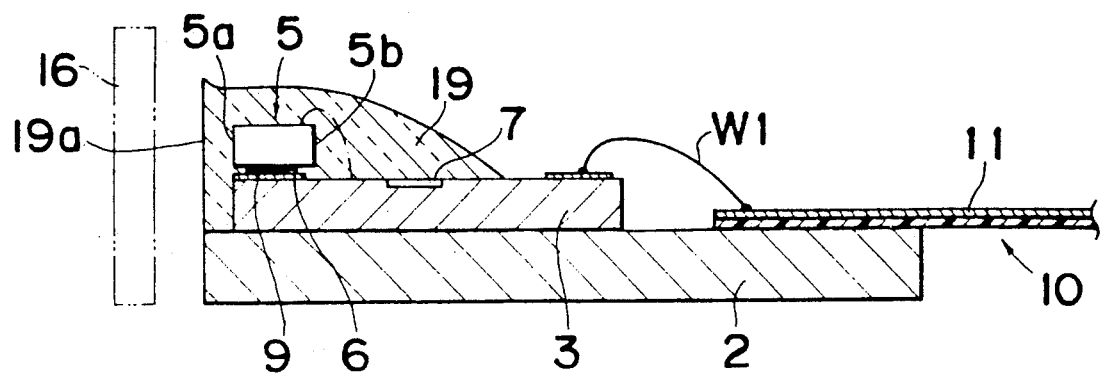
FIG. 4 is a view similar to FIG. 2, which particularly relates to a third embodiment.

Referring further to FIG. 4, there is shown a semiconductor laser unit L3 according to a third embodiment of the present invention, in which the front cleavage face 5a and the rear cleavage face 5b are covered by the same transparent resin material 19, while other constructions of the laser unit L3 are generally similar to those of the laser units of FIGS. 2 and 3, with like parts in FIGS. 2 and 3 being designated by like reference numerals for brevity of explanation.

In the third embodiment of FIG. 4 also, in the similar manner as in FIG. 2, the flat plate 16 of glass or the like is preliminarily erected at the front face of the substrate 2. and with the parting agent 17 (not shown in FIG. 4) being uniformly applied over one surface (i.e. the side face confronting the front cleavage face 5a) of the flat plate 16, the transparent resin material 19 in the form of a viscous liquid is filled by dripping between the flat plate 16 and the front cleavage face 5a of the laser chip 5, and over the upper surfaces of the rear cleavage face 5b and the light receiving element 7 for subsequent hardening. Thereafter, the flat plate 16 is removed, with a smooth face 19a being thus formed.

By the above practice, the smooth face of the transparent resin material can be formed, and simultaneously, the solid state waveguide member may be integrally formed.

Figure 5:
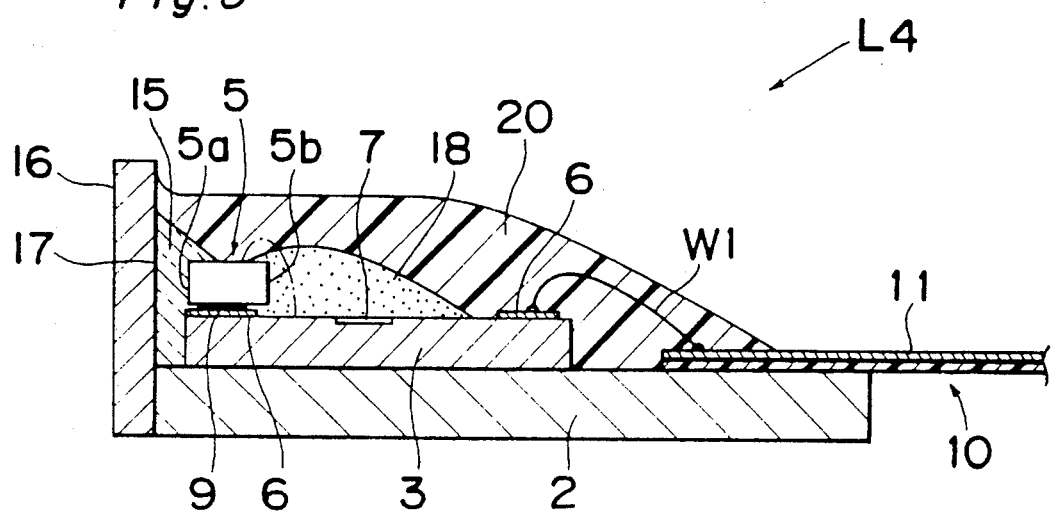
FIG. 5 and 6 are side sectional views similar to FIG. 2, which particularly show fourth and fifth embodiments according to the present invention.

Referring also to FIG. 5, there is shown a semi-conductor laser unit L4 according to a fourth embodiment of the present invention. In this semi-conductor laser unit L4, a protective seal resin material 20 is further applied from the upper surface of the transparent resin material 15 covering the front cleavage face 5a of the laser chip 5, up to the solid state waveguide member 18 and the wire-bonded portion of the flexible circuit 10 disposed therebehind as described earlier with reference to the semi-conductor laser unit L1 of the first embodiment of FIG. 2. By the above arrangement, breakage of the respective wires W1 to W4 or the sub-mount 3, etc. due to careless contact thereof with other items, or accidental short-circuiting and the like may be advantageously prevented.

It is to be noted here that such protective seal resin material may be further applied onto the semi-conductor laser unit L3 of the type shown in FIG. 4.

Figure 6:
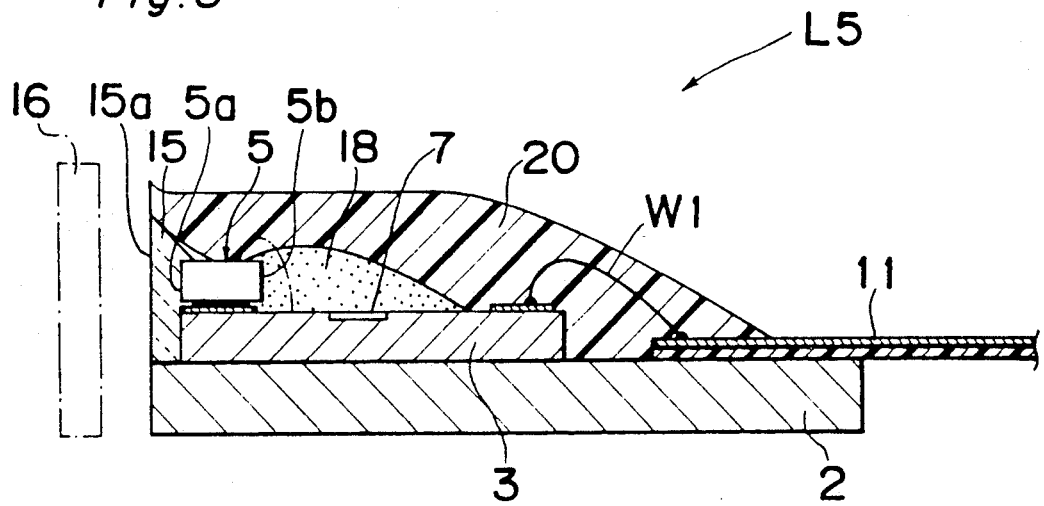

Referring further to FIG. 6, there is shown a semiconductor laser unit L5 according to a fifth embodiment of the present invention, in which, a light scattering agent such as $Al_2O_3$, titanium oxide or the like is mixed for dispersion only in the portion of the solid state waveguide member 18 connecting the rear cleavage face 5b and the upper surface of the light receiving element 7. The laser beam emitted from the rear cleavage face 5b is subjected to irregular reflection within the solid state waveguide member 18, thus making it possible to increase the amount of the laser beam arriving at the light receiving element 7.

It is to be noted here that the smooth face which is the front face in the transparent resin member for covering the front cleavage face 5a of the laser chip 5 is not limited to be a flat face, but may be of a curved face as in a convex lens or the like in which case, the flat plate referred to earlier may be replaced by a mold plate having a predetermined curve face.

Moreover, the transparent resin material may be modified to cover not only the sub-mount, but also the front face of the substrate.

As is clear from the foregoing description, according to the present invention, since the laser light from the front cleavage face in the laser chip can be directed in the normal direction of the smooth face through the smooth transparent resin member, beam characteristics of the laser beam can be improved.

Furthermore, if the smooth transparent resin member is so arranged to also cover the front cleavage face of the laser chip and the junction face with respect to the sub-mount, there is no possibility of occurrence of electrical short-circuit accidents due to adhesion of dew drops, etc. or deterioration in the performance of the semi-conductor chip, and thus, resistance against environment of the semi-conductor laser may be improved.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A semi-conductor laser unit comprising:
a substrate;
a laser chip bonded on said substrate through a sub-mount so as to project a laser beam towards the outside from a front cleavage face of said laser chip, said front cleavage face of said laser chip being covered by a transparent resin material, with a front face of said transparent resin material being formed into a smooth face; and
a light receiving element formed on said sub-mount so as to receive a laser light beam emitted from a rear cleavage face of said laser chip, said rear cleavage face and the upper surface of said light receiving element being connected by a solid state waveguide member.

2. A semi-conductor laser unit as claimed in claim 1, wherein said transparent resin material comprises a thermosetting resin prepared by mixing two kinds of liquids of epoxy resin.

3. A semi-conductor laser unit as claimed in claim 1, wherein said transparent resin material comprises a silicon resin which hardens upon drying.

4. A semi-conductor laser unit as claimed in claim 1, wherein said solid state waveguide member comprises a thermo-setting resin such as epoxy resin.

5. A semi-conductor laser unit as claimed in claim 1, wherein upper surfaces of said transparent resin material covering the front cleavage face of said laser chip, said solid state waveguide member, and a wire-bonded portion of a flexible circuit provided at a rear portion of said substrate are further covered by a protective resin layer formed to extend thereover.

6. A semi-conductor laser unit comprising:
a substrate; and
a laser chip bonded on said substrate through a sub-mount so as to project laser beam towards the outside from a front cleavage face of said laser chip;
said front cleavage face of said laser chip being covered by a transparent resin material, with a front face of said transparent resin material being formed into a smooth face;
said smooth face being formed in such a manner that with a flat plate of a glass erected at the front face side of said substrate and a parting agent applied over one face of said flat plate, when said transparent resin material in a viscous liquid state is filled between said flat plate and said front cleavage face of said laser chip, said transparent resin material is perfectly filled therebetween by a capillary action thereof so that said flat plane is fixed to said sub-mount.

7. A semi-conductor laser unit comprising:
a substrate;
a laser chip bonded on said substrate through a sub-mount so as to project a laser beam towards the outside from a front cleavage face of said laser chip, said front cleavage face of said laser chip being covered by a transparent resin material, with a front face of said transparent resin material being formed into a smooth face; and
a light receiving element formed on said sub-mount so as to receive a laser beam emitted from a rear cleavage face of said laser chip, said rear cleavage face and the upper surface of said light receiving element being connected by a solid state waveguide member, wherein upper surfaces of said transparent resin material covering said front cleavage face of said laser chip, said solid state waveguide member, and a wire-bonded portion of a flexible circuit provided at a rear portion of said substrate are further covered by a protective resin layer formed to extend thereover.

8. A semi-conductor laser unit comprising:
a substrate;
a laser chip bonded on said substrate through a sub-mount so as to project a laser beam towards the outside from a front cleavage face of said laser chip, said front cleavage face of said laser chip being covered by a transparent resin material with a front face of said transparent resin material being formed into a smooth face; and
a light receiving element formed on said sub-mount so as to receive a laser beam emitted from a rear cleavage face of said laser chip, said front cleavage face and said rear cleavage face of said laser chip, and the upper surface of said light receiving element being covered by said transparent resin material provided to extend thereover.

9. A method of forming a semi-conductor laser unit, comprising the steps of:
(a) preparing a substrate;
(b) fixedly mounting or bonding a sub-mount on the upper surface of said substrate;
(c) connecting a laser chip on the upper surface of said sub-mount for projecting a laser beam towards the outside from a front cleavage face of said laser chip;
(d) covering said front cleavage face of said laser chip with a transparent resin material;

(e) forming a front face of said transparent resin material into a smooth face;

(f) diffusing an impurity into said sub-mount to form a light receiving element for receiving a laser light beam emitted from a rear cleavage face of said laser chip; and (g) connecting said rear cleavage face of said laser chip and the upper surface of said light receiving element by a solid state waveguide member.

10. A method of forming a semi-conductor laser unit as claimed in claim 9, wherein said step (a) comprises applying nickel plating and gold plating over the surface of an aluminum plate to form said substrate.

11. A method of forming a semi-conductor laser unit as claimed in claim 9, wherein said step (b) comprises a connecting material such as indium to fixedly mount or bond said sub-mount on the upper surface of said substrate.

12. A method of forming a semi-conductor laser unit as claimed in claim 9, wherein said step (c) comprises an electrically conductive brazing material to connect said laser chip on the upper surface of said sub-mount.

13. A method of forming a semi-conductor laser unit as claimed in claim 9, further comprising the step of covering the upper surfaces of said transparent resin material covering said front cleavage face of said laser chip, said solid state waveguide member, and a wire-bonded portion of a flexible circuit provided at a rear portion of said substrate by a protective resin layer formed to extend thereover.

14. A method of forming a semi-conductor laser unit, comprising the steps of:

(a) preparing a substrate;

(b) fixedly mounting or bonding a sub-mount on the upper surface of said substrate;

(c) connecting a laser chip on the upper surface of said sub-mount for projecting a laser beam towards the outside from a front cleavage face of said laser chip;

(d) covering said front cleavage face of said laser chip with a transparent resin material;

(e) forming a front face of said transparent resin material into a smooth face;

(f) diffusing an impurity into said sub-mount to form a light receiving element for receiving a laser light beam emitted from a rear cleavage face of said laser chip; and (g) covering said front cleavage face and said rear cleavage face of said laser chip, and the upper surface of said light receiving element by said transparent resin material provided to extend thereover.

* * * * *